(12) United States Patent
Suenaga

(10) Patent No.: US 9,813,823 B2
(45) Date of Patent: Nov. 7, 2017

(54) PIEZOELECTRIC ELEMENT, AND PIEZOELECTRIC VIBRATING APPARATUS, PORTABLE TERMINAL, SOUND GENERATOR, SOUND GENERATING APPARATUS, AND ELECTRONIC DEVICE COMPRISING THE PIEZOELECTRIC ELEMENT

(71) Applicant: KYOCERA Corporation, Kyoto-shi, Kyoto (JP)

(72) Inventor: Hiroshi Suenaga, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/112,270

(22) PCT Filed: Jun. 27, 2014

(86) PCT No.: PCT/JP2014/067192
§ 371 (c)(1),
(2) Date: Jul. 18, 2016

(87) PCT Pub. No.: WO2015/114849
PCT Pub. Date: Aug. 6, 2015

(65) Prior Publication Data
US 2016/0337760 A1   Nov. 17, 2016

(30) Foreign Application Priority Data
Jan. 30, 2014   (JP) ................................. 2014-015703

(51) Int. Cl.
*H04R 17/00* (2006.01)
*H04R 1/02* (2006.01)
(Continued)

(52) U.S. Cl.
CPC ....... *H04R 17/005* (2013.01); *H01L 41/0471* (2013.01); *H01L 41/0472* (2013.01);
(Continued)

(58) Field of Classification Search
CPC ..................................................... H01L 41/053
See application file for complete search history.

(56) References Cited

U.S. PATENT DOCUMENTS

2005/0099097 A1* 5/2005 Baumgartner ........ H01L 41/277
310/334
2011/0285249 A1   11/2011 Ishii et al.
(Continued)

FOREIGN PATENT DOCUMENTS

JP   2007-109754 A   4/2007
JP   2012-209866 A   10/2012
(Continued)

OTHER PUBLICATIONS

International Search Report, PCT/JP2014/067192, dated Aug. 26, 2014, 2 pgs.

*Primary Examiner* — Duc Nguyen
*Assistant Examiner* — Phan Le
(74) *Attorney, Agent, or Firm* — Volpe and Koenig, P.C.

(57) ABSTRACT

A piezoelectric element includes: a stacked body in which internal electrodes and piezoelectric layers are laminated; surface electrodes disposed at least on one principal face of the stacked body; and side electrodes disposed on a side face of the stacked body, the internal electrodes extending to the side face, the side electrodes electrically connecting the internal electrodes extending to the side face and the surface electrodes. The internal electrodes each includes a first primary electrode having an active region and a led-out region extending to the side face of the stacked body, the internal electrodes each including a first secondary elec-
(Continued)

trode, the first primary electrodes being disposed in inter-piezoelectric layer regions, the first secondary electrodes being disposed in the inter-piezoelectric layer regions so as to be apart from the led-out regions of the first primary electrodes, and the first secondary electrode is connected to one of the side electrodes.

10 Claims, 12 Drawing Sheets

(51) Int. Cl.
      *H01L 41/047*     (2006.01)
      *H01L 41/09*     (2006.01)

(52) U.S. Cl.
      CPC ......... *H01L 41/0973* (2013.01); *H04R 1/026* (2013.01); *H04R 17/00* (2013.01); *H04R 2499/11* (2013.01); *H04R 2499/15* (2013.01)

(56) References Cited

U.S. PATENT DOCUMENTS

| | | | |
|---|---|---|---|
| 2012/0212100 A1* | 8/2012 | Lee | H01L 41/053 310/317 |
| 2013/0334933 A1* | 12/2013 | Ukai | F04B 43/046 310/366 |

FOREIGN PATENT DOCUMENTS

| | | |
|---|---|---|
| WO | 2010/087470 A1 | 8/2010 |
| WO | 2012/117738 A1 | 9/2012 |
| WO | 2012/117831 A1 | 9/2012 |

\* cited by examiner (a)

(b)

(c)

PIEZOELECTRIC ELEMENT, AND PIEZOELECTRIC VIBRATING APPARATUS, PORTABLE TERMINAL, SOUND GENERATOR, SOUND GENERATING APPARATUS, AND ELECTRONIC DEVICE COMPRISING THE PIEZOELECTRIC ELEMENT

TECHNICAL FIELD

The present invention relates to a piezoelectric element which is suitable for use in piezoelectric vibrating apparatuses, portable terminals, sound generators, sound generating apparatuses, and an electronic device, and also relates to a piezoelectric vibrating apparatus, a portable terminal, a sound generator, a sound generating apparatus, and an electronic device which comprise the piezoelectric element.

BACKGROUND ART

In general, a laminated piezoelectric element comprises a stacked body composed of a plurality of internal electrodes and a plurality of piezoelectric layers, and, the internal electrode has its end extended to part of the side faces of the stacked body for electrical connection with a side electrode disposed on that side face (refer to Patent Literature 1, for example). The piezoelectric element expands and contracts in a stacking direction when driven to operate, and in consequence a stress load is applied on the side face located at the end of the stacked body.

CITATION LIST

Patent Literature

Patent Literature 1: Japanese Unexamined Patent Publication JP-A 2007-109754

SUMMARY OF INVENTION

Technical Problem

As shown in FIG. 12, for example, in a bimorph piezoelectric element, a pattern 101 defining an internal electrode extending to a side face located at one end of a stacked body and a pattern 102 defining an internal electrode extending to a side face located at the other end of the stacked body differ from each other. More specifically, the pattern 101 of the internal electrode extending to the side face located at one end of the stacked body lies over a large widthwise area of the side face, whereas the pattern 102 of the internal electrode extending to the side face located at the other end of the stacked body lies over a region equal to or less than one-half of the widthwise area of the side face.

In this case, when driving the piezoelectric element, the stress applied to the side face located at the other end of the stacked body varies from part to part of the side face. More specifically, at the other end of the stacked body, a part to which the end of the internal electrode is extended and a vicinal part to which the end of the internal electrode is not extended are subjected to different stresses.

In particular, an increased displacement (greater flexural vibration) has been required for piezoelectric elements in recent years. This may lead to occurrence of delamination in the side face located at the end of the stacked body due to a stress load.

The invention has been devised in view of the circumstances as discussed supra, and accordingly an object of the invention is to provide a piezoelectric element capable of suppressing occurrence of delamination in a side face located at an end of a stacked body, and also provide a piezoelectric vibrating apparatus, a portable terminal, a sound generator, a sound generating apparatus, and an electronic device which comprise the piezoelectric element.

Solution to Problem

The invention provides a piezoelectric element comprising: a stacked body in which a plurality of internal electrodes and a plurality of piezoelectric layers are laminated; a plurality of surface electrodes disposed at least on one principal face of the stacked body; and a plurality of side electrodes disposed on a side face of the stacked body, the plurality of internal electrodes extending to the side faces, the plurality of side electrodes electrically connecting the plurality of internal electrodes extending to the side face and the plurality of surface electrodes, the plurality of internal electrodes each including a first primary electrode having an active region and a led-out region extending to the side face of the stacked body, the plurality of internal electrodes each including a first secondary electrode, the first primary electrodes being disposed in inter-piezoelectric layer regions, the first secondary electrodes being disposed in the inter-piezoelectric layer regions so as to be apart from the led-out regions of the first primary electrodes, and the first secondary electrode being connected to one of the plurality of side electrodes.

Moreover, the invention provides a piezoelectric vibrating apparatus comprising: the aforestated piezoelectric element; and a vibration plate joined to the other principal face of the stacked body constituting the piezoelectric element.

Moreover, the invention provides a portable terminal comprising: the aforestated piezoelectric element; an electronic circuit; a display; and a housing, the other principal face of the piezoelectric element being joined to the display or the housing.

Moreover, the invention provides a sound generator comprising: the aforestated piezoelectric element; a vibration plate to which the piezoelectric element is attached, the vibration plate vibrating in response to vibration of the piezoelectric element; and a support body attached to at least part of an outer periphery of the vibration plate, the support body supporting the vibration plate.

Moreover, the invention provides a sound-generating apparatus comprising: the aforestated sound generator; and a housing which accommodates the sound generator.

Moreover, the invention provides an electronic device comprising: the aforestated sound generator; an electronic circuit connected to the sound generator; and a housing which accommodates the electronic circuit and the sound generator, the electronic device having a function of causing the sound generator to produce sound.

Advantageous Effects of Invention

In the piezoelectric element pursuant to the invention, the strength of adhesion between the side face located at the end of the stacked body and the side electrode is increased, thus suppressing occurrence of delamination in the side face located at the end of the stacked body.

Moreover, the piezoelectric vibrating apparatus, the portable terminal, the sound generator, the sound generating apparatus, and the electronic device which comprise the aforestated piezoelectric element can be driven to operate with stability for a long period of time by virtue of their excellent durability.

DESCRIPTION OF EMBODIMENTS

An embodiment of a piezoelectric element pursuant to the invention will be described in detail with reference to drawings.

Figure 1:
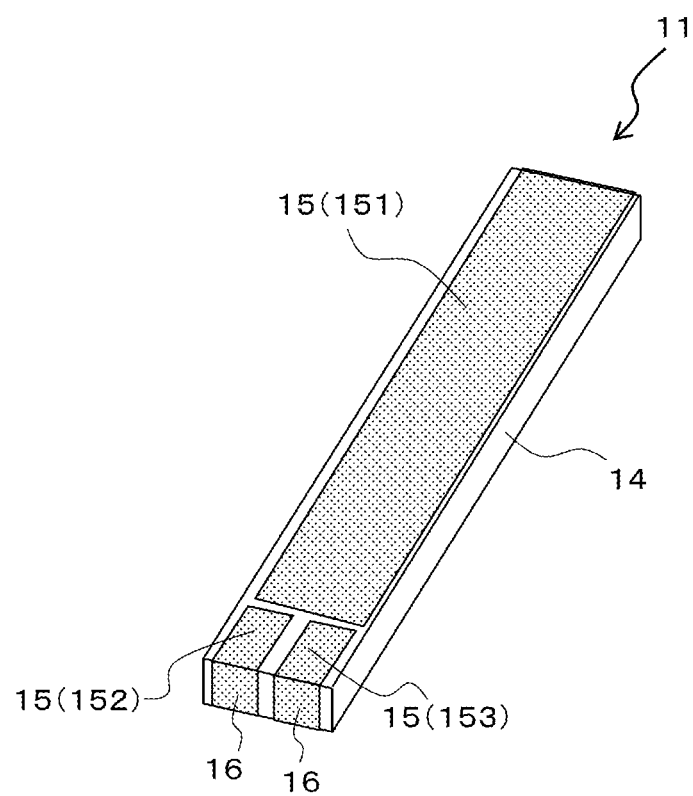
FIG. 1 is a schematic perspective view showing an embodiment of a piezoelectric element pursuant to the invention.
Figure 2:
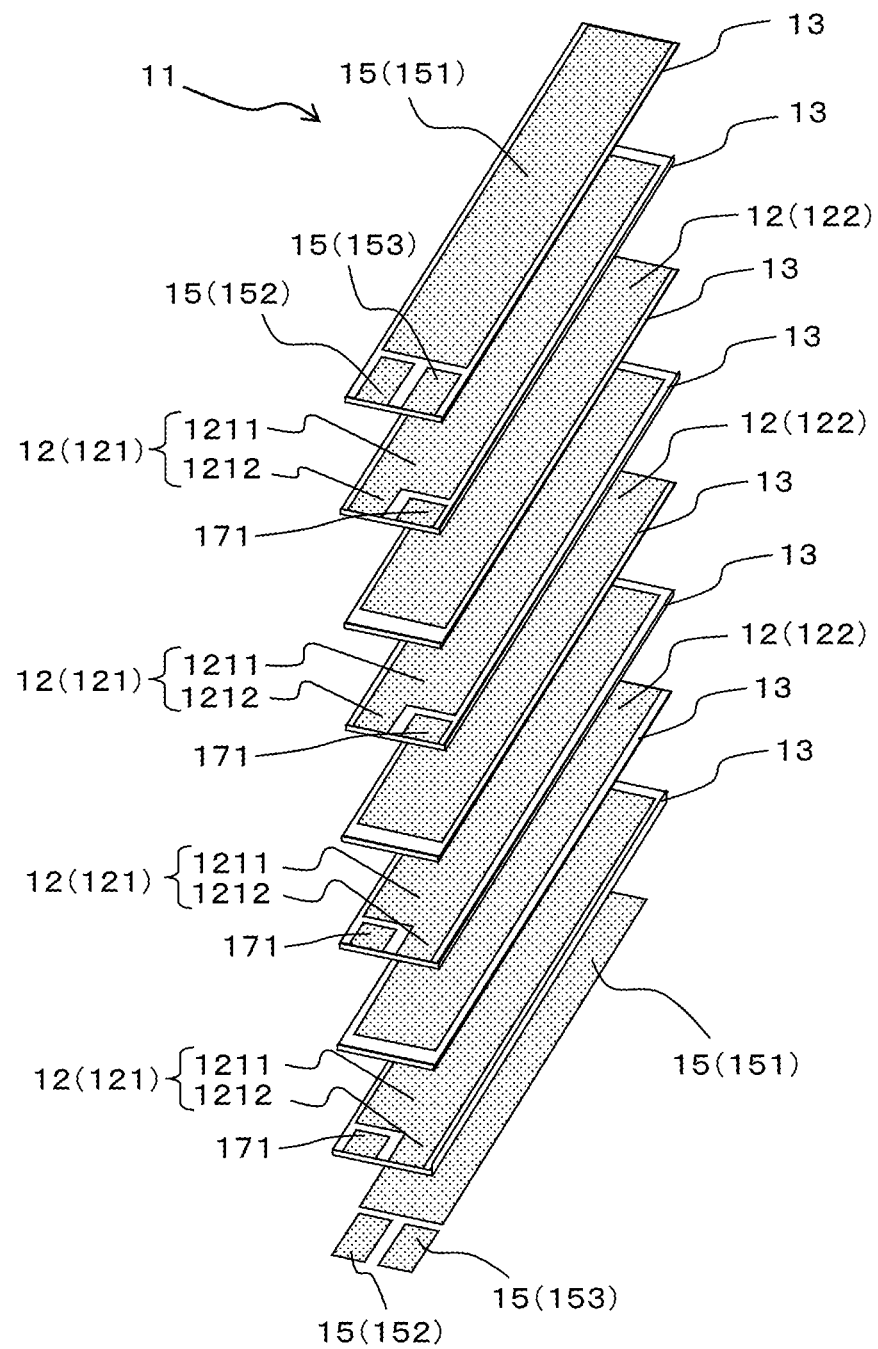
FIG. 2 is an exploded perspective view showing the piezoelectric element shown in FIG. 1.

FIG. 1 is a schematic perspective view showing an embodiment of a piezoelectric element pursuant to the invention, and, FIG. 2 is an exploded perspective view showing the piezoelectric element shown in FIG. 1. In FIG. 2, a side electrode 16 shown in FIG. 1 is omitted from the construction.

A piezoelectric element 11 in the embodiment shown in FIGS. 1 and 2 comprises: a stacked body 14 in which a plurality of internal electrodes 12 and a plurality of piezoelectric layers 13 are laminated; a plurality of surface electrodes 15 disposed at least on one principal face of the stacked body 14; and a plurality of side electrodes 16 disposed on a side face of the stacked body 14, the plurality of internal electrodes extending to the side faces, the plurality of side electrodes 16 electrically connecting the plurality of internal electrodes 12 extending to the side face and the plurality of surface electrodes 15. The plurality of internal electrodes 12 each include a first primary electrode 121 having an active region 1211 and a led-out region 1212 extending to the side face of the stacked body 14, the plurality of internal electrodes 12 each including a first secondary electrode 171, the first primary electrodes being disposed in inter-piezoelectric layer 13 regions, the first secondary electrodes 171 being disposed in the inter-piezoelectric layer 13 regions so as to be apart from the led-out regions 1212. The first secondary electrode 171 is connected to one of the plurality of side electrodes 16.

The stacked body 14 constituting the piezoelectric element 11 in the present embodiment comprises a stack of the plurality of internal electrodes 12 and the plurality of piezoelectric layers 13 in the form of a rectangular plate having one principal face defined by lengthwise sides and widthwise sides, as seen in a plan view. The piezoelectric element has an active section in which a plurality of adjacent internal electrodes 12 are arranged in overlapping relation to each other in a stacking direction, and an inactive section which is a part other than the active section. In a case where the piezoelectric element is built as a piezoelectric actuator which is attached to a display or a housing of a portable terminal, the length of the stacked body 14 falls preferably in the range of, for example, 18 mm to 28 mm, or more preferably in the range of 22 mm to 25 mm. The width of the stacked body 14 falls preferably in the range of, for example, 1 mm to 6 mm, or more preferably in the range of 3 mm to 4 mm. The thickness of the stacked body 14 falls preferably in the range of, for example, 0.2 mm to 1.0 mm, or more preferably in the range of 0.4 mm to 0.8 mm.

The plurality of internal electrodes 12 constituting the stacked body 14, which are formed through co-firing with ceramics for forming the piezoelectric layers 13, include the first primary electrodes 121 and second primary electrodes 122. The first primary electrodes 121, as well as the second primary electrodes 122, and the plurality of piezoelectric layers 13 are alternately laminated together so that the piezoelectric layer 13 is sandwiched between the first primary electrode 121 and the second primary electrode 122 vertically. The first primary electrode 121 and the second primary electrode 122 are successively placed in the order named as a stacking order, and, a driving voltage is applied to the piezoelectric layer 13 sandwiched between these electrodes. As the constituent material, use can be made of, for example, a conductor predominantly composed of silver or a silver-palladium alloy whose reactivity with piezoelectric ceramics is low, a conductor containing, for example, copper or platinum, or a material obtained by adding a ceramic component or glass component to the conductor material as given above.

In the embodiment shown in FIGS. 1 and 2, the primary electrodes include the first primary electrodes 121 and the second primary electrodes 122 arranged alternately in the stacking direction, and, the ends of the first primary electrodes 121 and the second primary electrodes 122 are extended to the corresponding paired opposite side faces of the stacked body 14 so as to be staggered with respect to each other. Among the primary electrodes constituting the plurality of internal electrode 12, the first primary electrode 121 is a primary electrode having the active region 1211 and the led-out region 1212 extending to the side face of the stacked body 14, and the second primary electrode 122 is a primary electrode opposed to the active region 1211 of the first primary electrode 121 as seen in a transparent plan view in the stacking direction of the stacked body 14.

The active region 1211 of the first primary electrode 121 opposed to the second primary electrode 122 is a relatively wide rectangular region which constitutes the active section. The led-out region 1212 having a width smaller than the width of the active region 1211 is extended to one of the paired opposite side faces of the stacked body 14 so as to make electrical connection with one of the plurality of side electrodes 16. Meanwhile, the second primary electrode 122 is rectangular-shaped, and has its lengthwise one end extended to the other one of the paired opposite side faces of the stacked body 14 so as to make electrical connection with the other one of the plurality of side electrodes 16. The side electrode 16 connected to the second primary electrode 122 is not represented graphically. In a case where the piezoelectric element is of a type which is attached to a display or a housing of a portable terminal, the length of the internal electrode 12 (the first primary electrode 121, the second primary electrode 122) falls preferably in the range of, for example, 17 mm to 25 mm, or more preferably in the range of 21 mm to 24 mm. The width of the active section in the internal electrode 12, or equivalently the width of the active region 1211 in the first primary electrode 121 and the width of the second primary electrode 122, falls preferably in the range of, for example, 1 mm to 5 mm, or more preferably in the range of 2 mm to 4 mm. The thickness of the internal electrode 12 falls preferably in the range of, for example, 0.1 µm to 5 µm. Further details of the configuration of the first primary electrode 121 and the description of the first secondary electrode 171 will be given later.

The piezoelectric layer 13 constituting the stacked body 14 is made of ceramics having piezoelectric properties. As such ceramics, use can be made of, for example, a perovskite oxide composed of lead zirconate titanate ($PbZrO_3$—$PbTiO_3$), lithium niobate ($LiNbO_3$), and lithium tantalate ($LiTaO_3$). It is preferable to adjust the single-layer thickness of the piezoelectric layer to fall in the range of 0.01 mm to 0.1 mm, for example, to effect actuation under low-voltage conditions. Moreover, it is preferable that the piezoelectric layer has a piezoelectric constant $d31$ at a level of greater than or equal to 200 pm/V to obtain large flexural vibration.

On one principal face of the stacked body 14 are disposed the plurality of surface electrodes 15 electrically connected to the plurality of internal electrodes 12. The surface electrodes 15 of the embodiment shown in FIG. 1 include a first surface electrode 151 having a large area, and a second surface electrode 152 and a third surface electrode 153 each having a small area. For example, the first surface electrode 151 is electrically connected to the internal electrode 12 constituting the second primary electrode 122, the second surface electrode 152 is electrically connected to, for example, the internal electrode 12 constituting the first primary electrode 121 placed on one principal face of the stacked body 14, and the third surface electrode 153 is electrically connected to, for example, the internal electrode 12 constituting the first primary electrode 121 placed on the other principal face of the stacked body 14. In a case where the piezoelectric element is built as a piezoelectric actuator which is attached to a display or a housing of a portable terminal, the length of the first surface electrode 151 falls preferably in the range of, for example, 17 mm to 23 mm, or more preferably in the range of 19 mm to 21 mm. The width of the first surface electrode 151 falls preferably in the range of, for example, 1 mm to 5 mm, or more preferably in the range of 2 mm to 4 mm. The length of each of the second surface electrode 152 and the third surface electrode 153 falls preferably in the range of 1 mm to 3 mm, for example. The width of each of the second surface electrode 152 and the third surface electrode 153 falls preferably in the range of 0.5 mm to 1.5 mm, for example. The surface electrode is provided in the form of a plurality of portions, namely the first surface electrode 151, the second surface electrode 152, and the third surface electrode 153, to design the piezoelectric element 11 pursuant to the invention as a so-called bimorph piezoelectric element in which the piezoelectric layer 13 located on one principal face side of the piezoelectric element 11 and the piezoelectric layer 13 located on the other principal face side thereof are polarized in symmetric relation to each other. In use, for example, the second surface electrode 152 and the third surface electrode 153 are connected to each other by wire binding before the actuation of the piezoelectric element 11.

In the piezoelectric element 11 in the present embodiment, the first secondary electrode 171 is provided in an inter-piezoelectric layer 13 region in which the first primary electrode 121 is located, in spaced relation to the led-out region 1212. In this embodiment, the led-out region 1212 constituting the first primary electrode 121 has a width which is substantially equal to one-half of the width of the active region 1211. Accordingly, an area free from the active region 1211 and the led-out region 1212 of the first primary electrode 121 is left. In this area, the first secondary electrode 171 is placed in spaced relation to the active region 1211 and the led-out region 1212 to avoid electrical connection with them. The first secondary electrode 171 is connected to one of the plurality of side electrodes 16.

In this construction, since the led-out region 1212 and the first secondary electrode 171 are each extended to the side face of the stacked body 14 for electrical connection with the side electrode 16, as contrasted to a construction devoid of the first secondary electrode 171, the number of connections of the internal electrodes 12 with the side electrode 16 is increased. The electrode (the first secondary electrode 171) is joined to the side electrode 16 with a joining force greater than that with which the piezoelectric layer 13 is joined to the side electrode 16, wherefore the strength of adhesion between the side face located at the end of the stacked body 14 and the side electrode 16 is increased. This makes it possible to restrain the side electrode 16 against accidental separation from the side face located at the end of the stacked body 14, as well as to suppress occurrence of delamination in the stacked body 14 at the side face located at its end.

It is preferable that, as shown in FIG. 1, the first primary electrode 121 and the first secondary electrode 171 disposed both in an inter-piezoelectric layer 13 region are connected to different side electrodes 16. In the embodiment shown in FIG. 2, the first primary electrode 121 and the first secondary electrode 171 disposed both in an inter-piezoelectric layer 13 region are electrically connected to one side electrode 16 and the other side electrode 16, respectively.

Specifically, in the stacked body 14 shaped in a rectangular plate as seen in a plan view, the arrangement of the first primary electrode 121 and the first secondary electrode 171 located on one principal face side in the stacking direction of the stacked body 14 and the arrangement of the first primary electrode 121 and the first secondary electrode 171 located on the other principal face side in the stacking direction of the stacked body 14 are in line-symmetric relation to each other about a widthwise central axis. Thus, the first primary electrode 121 located on one principal face side and the first secondary electrode 171 located on the other principal face side are electrically connected to one side electrode 16, and the first primary electrode 121 located on the other principal face side and the first secondary electrode 171 located on one principal face side are electrically connected to the other side electrode 16.

Since the first primary electrode 121 and the first secondary electrode 171 disposed both in an inter-piezoelectric layer 13 region are connected to different side electrodes 16, it is possible to form the plurality of mutually insulated side electrodes 16 so as to extend in the stacking direction. In this case, for example, a plurality of side electrodes 16 extending in the stacking direction can be provided in accordance with various electrode patterns of the surface electrode 15 and the internal electrode 12 in the bimorph piezoelectric element, thus achieving an increase in the total area of the region where the plurality of side electrodes 16 are joined to the side face of the stacked body 14. This makes it possible to increase the binding force with which the side electrode 16 is bound on the side face of the stacked body 14, and thereby increase the adhesion strength.

Moreover, the aforestated construction is preferably provided with a region where the first secondary electrode 171 and the second primary electrode 122 are opposed to each other as seen in a transparent plan view in the stacking direction of the stacked body 14. In this case, the piezoelectric layer 13 located in the vicinity of the first secondary electrode 171 can be polarized inversely to the piezoelectric layer 13 located in the vicinity of the first primary electrode 121 disposed both in an inter-piezoelectric layer 13 region in which the first secondary electrode 171 is located. This inverse polarization acts to cancel out displacement, wherefore occurrence of delamination can be suppressed even further.

Moreover, the first primary electrode 121 and the first secondary electrode 171 disposed both in an inter-piezoelectric layer 13 region may be extended to different side faces. For example, although, in the drawing, both the led-out region 1212 and the first secondary electrode 171 are extended to a common side face (end face) located at a short side of a rectangle defining the shape of one principal face, one of or both of the led-out region 1212 and the first secondary electrode 171 may be extended to that part of a side face located at a long side of the rectangle which lies near the end face.

However, as shown in the drawing, the first primary electrode 121 and the first secondary electrode 171 disposed both in an inter-piezoelectric layer 13 region are preferably both extended to the same side face. Extending these electrodes to the same side face makes it possible to achieve concentration of the binding force with which the side electrode 16 is bound on the side face of the stacked body 14, and thereby suppress occurrence of delamination even further. It is advisable that the above-mentioned same side face should be a side face (end face) which is subjected to a large stress, and is located at a short side of the rectangle defining the shape of one principal face. That is, it is preferable that in the stacked body 14 shaped in a rectangular plate as seen in a plan view, the first primary electrode 121 and the first secondary electrode 171 are both extended to an end face.

Moreover, while the led-out region 1212 of the first primary electrode 121 and the first secondary electrode 171 may be designed to have different widths, as shown in the drawing, it is preferable that the led-out region 1212 of the first primary electrode 121 and the first secondary electrode 171 are equal in width. In this case, the pattern of the led-out region 1212 in the first primary electrode 121 and the pattern of the first secondary electrode 171 are approximated to each other, thus achieving a well-balanced configuration. Accordingly, the piezoelectric element is balanced in respect of the influence of sintering shrinkage behavior, wherefore higher adhesion strength can be attained with consequent further suppression in occurrence of delamination.

Moreover, it is preferable that the materials for forming the first primary electrode 121, the second primary electrode 122, and the first secondary electrode 171, are same in composition. In this case, due to their materials, the first primary electrode 121, the second primary electrode 122, and the first secondary electrode 171 are same in strength of joining of them to the corresponding piezoelectric layers 13, and are also equal in sintering shrinkage behavior, in adhesion mechanism, and in thermal expansion coefficient, wherefore the adhesion strength can be further increased for suppression in occurrence of delamination.

It is preferable that the first secondary electrode 171 is smaller in area than the surface electrode 15 (the second surface electrode 152, the third surface electrode 153) from the standpoint of the joining force for the connection with the side electrode 16, as well as the standpoint of causing the outermost piezoelectric layer 13 to undergo oppositely directed displacement.

Figure 3:
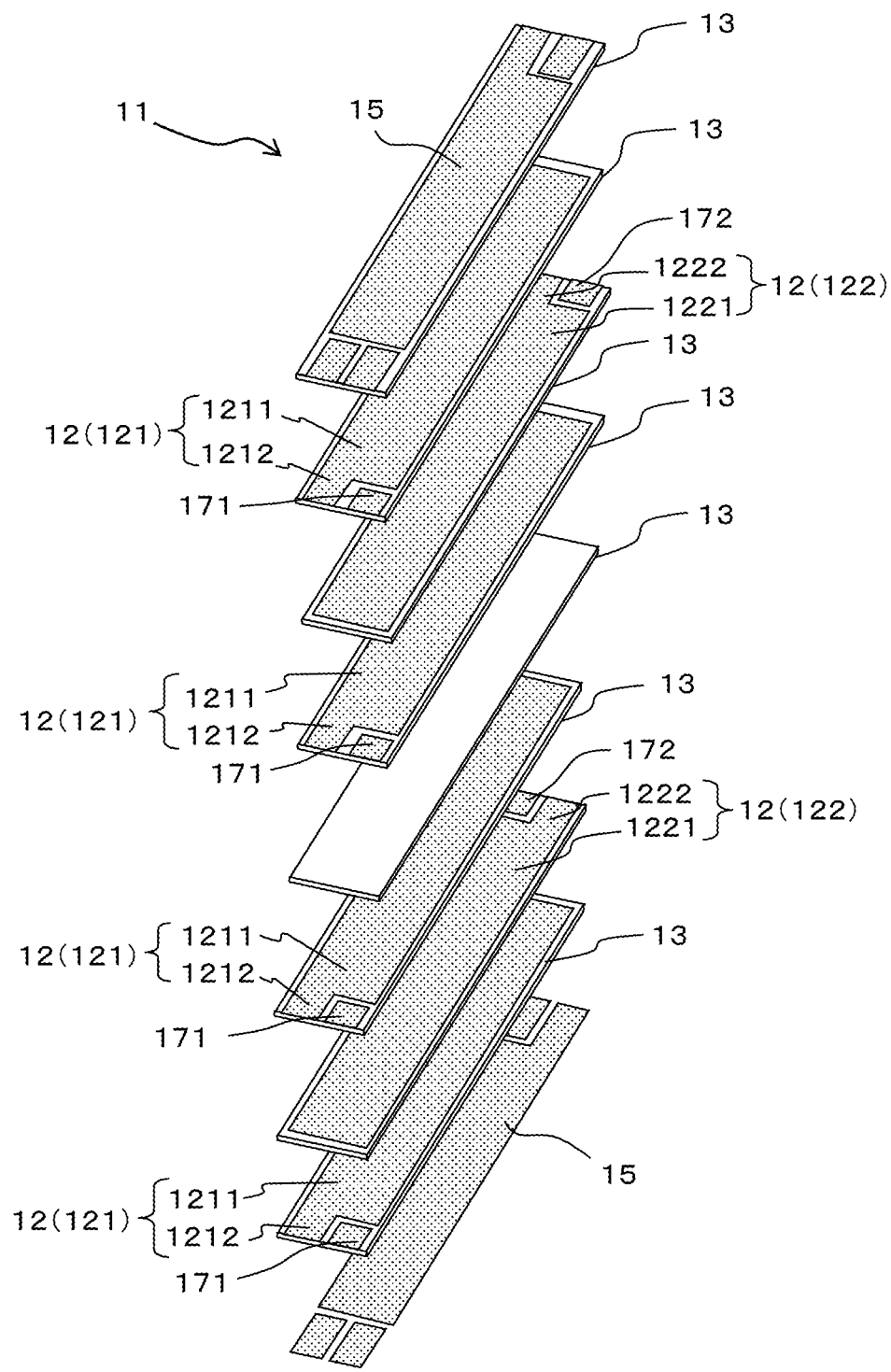
FIG. 3 is a exploded perspective view showing an another embodiment of a piezoelectric element pursuant to the invention.
Figure 4:
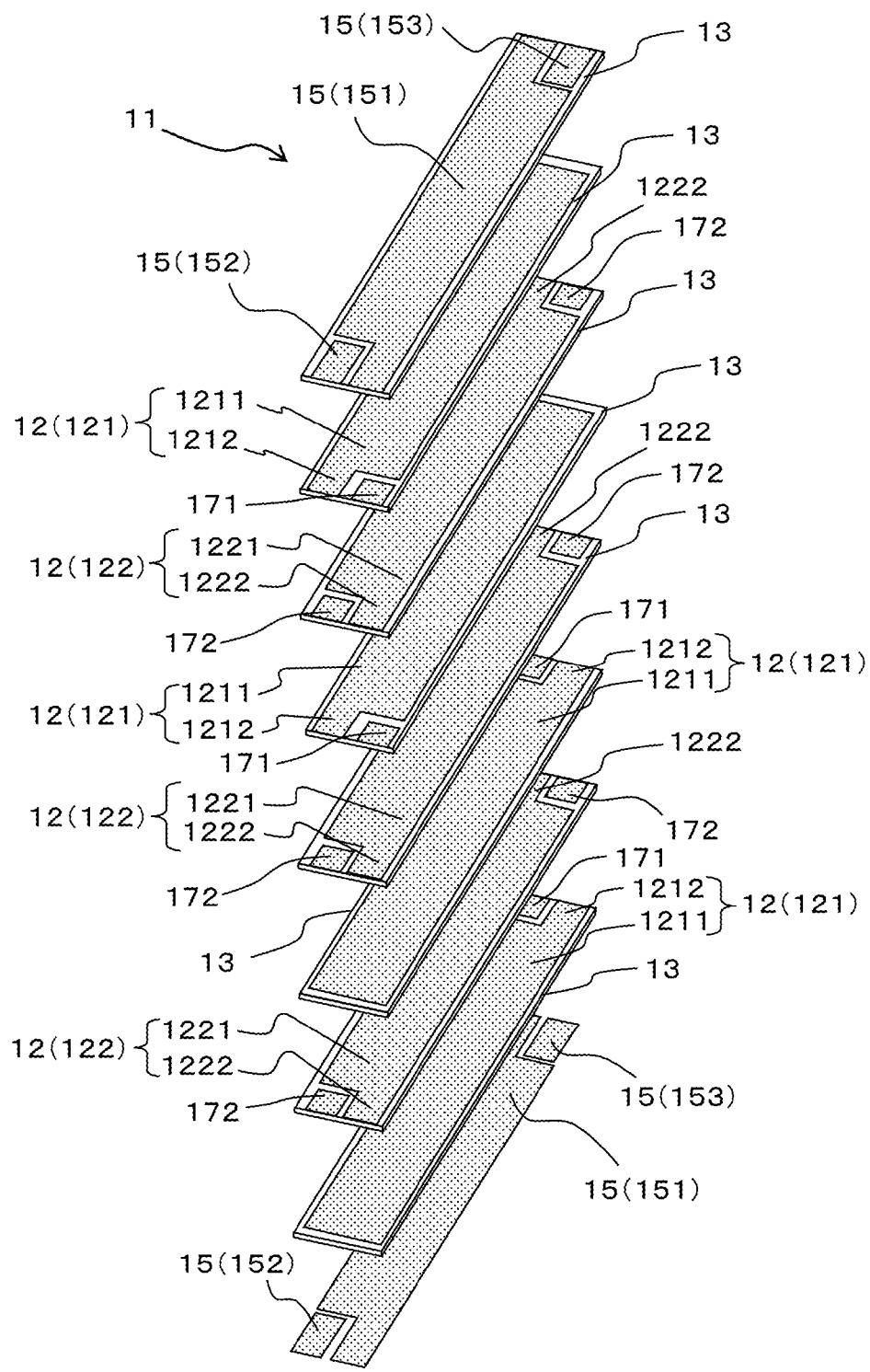
FIG. 4 is a exploded perspective view showing an another embodiment of a piezoelectric element pursuant to the invention.

By way of another embodiment of the piezoelectric element pursuant to the invention, a form as shown in FIG. 3, or a form as shown in FIG. 4 may be adopted.

In the piezoelectric element 11 shown in FIGS. 3 and 4, the second primary electrode 122 comprises an active region 1221 and a led-out region 1222 extending to the side face of the stacked body 14, and, a second secondary electrode 172 is provided in an inter-piezoelectric layer 13 region in which the second primary electrode 122 is located, in spaced relation to the led-out region 1222. The second secondary electrode 172 is connected to one of the plurality of side electrodes 16. Note that the plurality of side electrodes 16 are not shown in FIGS. 3 and 4.

In the piezoelectric element 11 shown in FIG. 3, specifically, the active region 1221 of the second primary electrode 122 opposed to the first primary electrode 121 is a relatively wide rectangular region which constitutes the active section facing the first primary electrode 121. The led-out region 1222 of the second primary electrode 122 is a region which is smaller in width than the active region 1221. In this embodiment, the pattern of the second primary electrode 122 located on one principal face side is in line-symmetric relation to the pattern of the first primary electrode 121 with respect to a lengthwise central axis. The led-out region 1222 is extended to an end face corresponding to the other one of the paired opposite side faces of the stacked body 14 (end face opposite the end face to which is extended the led-out region 1212) so as to make electrical connection with the side electrode 16. Moreover, the pattern of the second primary electrode 122 located on the other principal face side is in point-symmetric relation to the pattern of the first primary electrode 121.

Moreover, the second primary electrode 122 comprises the active region 1221 and the led-out region 1222 extending to an end face corresponding to the other one of the paired opposite side faces of the stacked body 14, and, the second secondary electrode 172 is provided in an inter-piezoelectric layer 13 region in which the second primary electrode 122 is located, in spaced relation to the led-out region 1222. The second secondary electrode 172 is extended to the end face corresponding to the other one of the paired opposite side faces of the stacked body 14 so as to make connection with one of the plurality of side electrodes 16. Moreover, a plurality of surface electrodes 15 are also provided, and, as is the case with the embodiment shown in FIGS. 1 and 2, in use, these surface electrodes are connected to each other by wire binding or otherwise before the actuation of the piezoelectric element 11.

In this case, although not shown in the drawings, the side face (end face) located at one end of the piezoelectric element 11 is provided with two side electrodes extending in the stacking direction, and, the side face (end face) located at the other end of the piezoelectric element 11 is provided with two side electrodes extending in the stacking direction.

The first primary electrode 121 is electrically connected to one side electrode disposed on the side face (end face) located at the one end, and, the first secondary electrode 171 is electrically connected to the other side electrode disposed on the side face located at the one end.

The second primary electrode 122 located on the one principal face side in the stacking g direction and the second secondary electrode 172 located on the other principal face side in the stacking direction are each electrically connected to one side electrode disposed on the side face (end face) located at the other end, and, the second primary electrode 122 located on the other principal face side in the stacking direction and the second secondary electrode 172 located on the one principal face side in the stacking direction are each electrically connected to the other side electrode disposed on the side face (end face) located at the other end.

In this construction in which the second primary electrode 122 has the led-out region 1222, the strength of adhesion with the side electrode is increased, wherefore occurrence of delamination can be suppressed. Moreover, the piezoelectric element is balanced in respect of the influence of sintering shrinkage behavior, wherefore higher adhesion strength can be attained with consequent further suppression in occurrence of delamination.

Moreover, in the piezoelectric element 11 shown in FIG. 4, specifically, the active region 1221 of the second primary electrode 122 opposed to the first primary electrode 121 is a relatively wide rectangular region which constitutes the active section facing the first primary electrode 121. The led-out region 1222 of the second primary electrode 122 is a region which is smaller in width than the active region 1221. In this embodiment, two led-out regions 1222 are provided in the second primary electrode 122. The two led-out regions are patterned in point-symmetric relation to each other. The led-out regions 1222 are extended to the paired opposite side faces of the stacked body 14 (a side face (end face) located at one end of the stacked body 14 and a side face (end face) located at the other end thereof), respectively, so as to make electrical connection with the corresponding side electrodes 16.

Moreover, the surface electrodes 15 (the first surface electrode 151 having a large area, and the second surface electrode 152 and the third surface electrode 153 which have a small area) are patterned similarly to the second primary electrode 122 and the second secondary electrode 172, respectively.

Moreover, the first primary electrode 121 located on the upper side of the piezoelectric element in the stacking direction and the first primary electrode 121 located on the lower side thereof in the stacking direction are extended to the side faces located at the opposite ends, respectively, of the piezoelectric element, and, the first secondary electrode 171 lies in an inter-piezoelectric layer 13 region in which the corresponding first primary electrode 121 is located, in spaced relation to the led-out region 1212. The upper first primary electrode 121 and the lower first primary electrode 121 are patterned in point-symmetric relation to each other.

In this case, although not shown in the drawings, the side face located at one end of the piezoelectric element 11 is provided with two side electrodes extending in the stacking direction, and, the side face located at the other end of the piezoelectric element 11 is provided with two side electrodes extending in the stacking direction. The first primary electrode 121 located on the upper side of the piezoelectric element 11 in the stacking direction, the first secondary electrode 171 located on the lower side thereof in the stacking direction, and the second surface electrode 152 are each electrically connected to one side electrode disposed on the side face located at the one end, and, the first primary electrode 121 located on the lower side of the piezoelectric element 11 in the stacking direction, the first secondary electrode 171 located on the upper side thereof in the stacking direction, and the third surface electrode 152 are each electrically connected to one side electrode disposed on the side face located at the other end. Moreover, the other side electrode disposed on each side face is electrically connected to the second primary electrode 122 (the led-out region 1222) and the first surface electrode 151.

In this construction, the led-out region 1212 of the first primary electrode 121, the led-out region 1222 of the second primary electrode 122, and the first secondary electrode 171 are patterned in symmetric relation to the side electrode, wherefore the strength of adhesion with the side electrode in the side face located at the one end and the strength of adhesion with the side electrode in the side face located at the other end are increased to substantially the same extent, thus suppressing occurrence of delamination. Moreover, the piezoelectric element is balanced in respect of the influence of sintering shrinkage behavior, wherefore higher adhesion strength can be attained with consequent further suppression in occurrence of delamination.

Also in the construction shown in FIGS. 3 and 4, it is preferable to provide a region where the second secondary electrode 172 and the first primary electrode 121 are opposed to each other as seen in a transparent plan view in the stacking direction of the stacked body 14. In this case, the piezoelectric layer 13 located in the vicinity of the second secondary electrode 172 can be polarized inversely to the piezoelectric layer 13 located in the vicinity of the second primary electrode 122 lying in an inter-piezoelectric layer 13 region in which the second secondary electrode 172 is located. This inverse polarization acts to cancel out displacement, wherefore occurrence of delamination can be suppressed even further.

Moreover, also in the construction shown in FIGS. 3 and 4, it is preferable that the materials for forming the first primary electrode 121, the second primary electrode 122, the first secondary electrode 171, and the second secondary electrode 172, are same in composition. In this case, due to their materials, the first primary electrode 121, the second primary electrode 122, the first secondary electrode 171, and the second secondary electrode 172 are same in strength of joining of them to the corresponding piezoelectric layers 13, and are also equal in sintering shrinkage behavior, in adhesion mechanism, and in thermal expansion coefficient, wherefore the adhesion strength can be further increased for suppression in occurrence of delamination.

The aforestated piezoelectric element pursuant to the invention is a so-called bimorph piezoelectric element which is flexurally vibrated in a manner such that one and the other principal faces thereof become curved surfaces upon the input of an electric signal through the surface electrode 15. Although the bimorph piezoelectric element undergoes greater flexural vibration than a unimorph piezoelectric element, as a piezoelectric actuator embodying the invention, the piezoelectric element is not limited to the bimorph type, but may be of the unimorph type. For example, by joining (bonding) the other principal face of the piezoelectric actuator to a vibration plate which will hereafter be described, the piezoelectric actuator is, even if it is of the unimorph type, capable of flexural vibration.

The following describes a method of manufacturing the piezoelectric element 11 in the present embodiment.

At first, a ceramic green sheet which constitutes the piezoelectric layer 13 is prepared. Specifically, a ceramic slurry is prepared by mixing calcined powder of piezoelectric ceramics, a binder made of an organic high polymer such as acrylic polymer or butyral polymer, and a plasticizer. Then, a ceramic green sheet is prepared using the ceramic slurry by a tape molding technique such as the doctor blade method or the calender roll method. The piezoelectric ceramics may be any given ceramics having piezoelectric properties, and, for example, use can be made of a perovskite oxide made of lead zirconate titanate ($PbZrO_3$—$PbTiO_3$). Moreover, as the plasticizer, for example, use can be made of dibutyl phthalate (DBP) or dioctyl phthalate (DOP).

Next, an electrically conductive paste which constitutes the internal electrode is prepared. Specifically, the conductive paste is prepared by admixing a binder and a plasticizer in metallic powder of a silver-palladium alloy. This conductive paste is applied in an internal-electrode pattern (a first primary electrode 121 pattern, a second primary electrode 122 pattern, a first secondary electrode 171 pattern, and, on an as needed basis, a second secondary electrode 172 pattern) onto the above-mentioned ceramic green sheet by means of screen printing. Then, the plurality of ceramic green sheets bearing the printed conductive paste are laminated on top of each other in layers, and, the thereby obtained laminate is subjected to debinding, or binder removal treatment at a predetermined temperature, is fired at a temperature of 900 to 1200° C., and is ground into a predetermined configuration by means of a surface grinder or otherwise, whereby a stacked body comprising a stack of alternate internal electrodes 12 (primary electrodes and secondary electrodes) and piezoelectric layers 13 is produced.

The stacked body is not limited to one produced by the aforestated manufacturing method, and it is thus possible to adopt any given manufacturing method which allows production of a stacked body comprising a stack of a plurality of internal electrodes and piezoelectric layers.

After that, surface electrodes are formed by printing a silver glass-containing conductive paste, which is prepared by adding a binder, a plasticizer, and a solvent to a mixture of glass and conductive particles composed predominantly of silver, onto the principal face and the side face of the stacked body in surface-electrode patterns by means of screen printing or otherwise, drying it, and performing baking at a temperature of 600 to 750° C.

The piezoelectric element in the present embodiment can be produced by the method thus far described.

Figure 5:
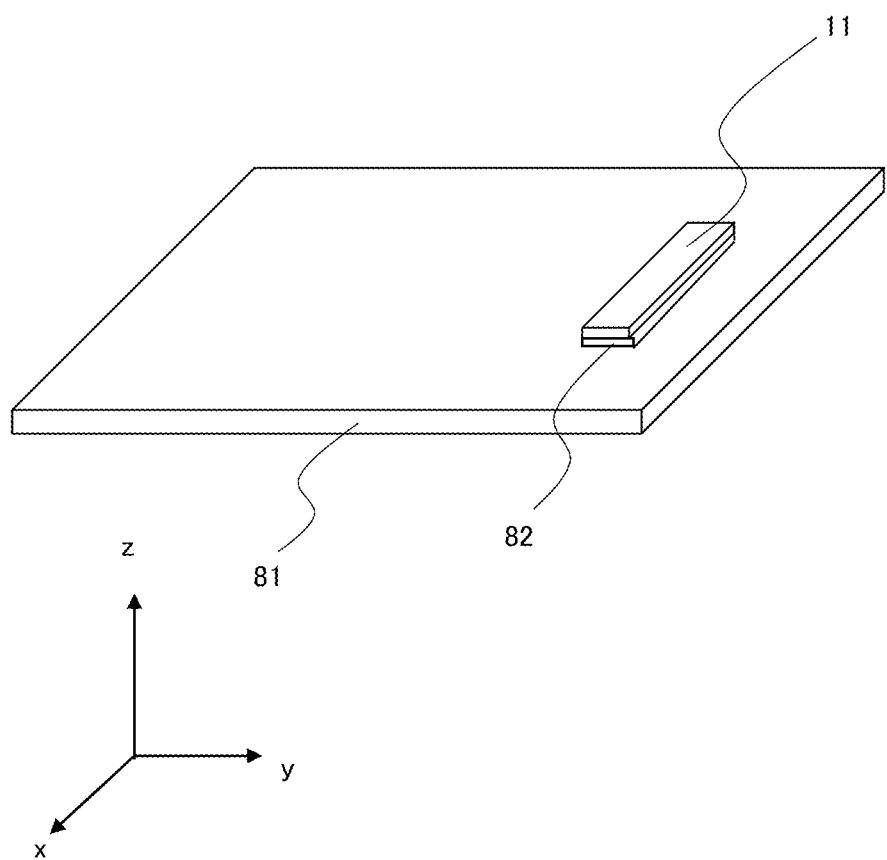
FIG. 5 is a schematic perspective view schematically showing an embodiment of a piezoelectric vibrating apparatus pursuant to the invention.

Moreover, as shown in FIG. 5, a piezoelectric vibrating apparatus in the present embodiment comprises the piezoelectric element 11 and a vibration plate 81 joined to the other principal face of the piezoelectric element 11.

For example, the vibration plate 81 is shaped like a rectangular thin plate. The vibration plate 81 may be formed with proper use of a material having high rigidity and great elasticity, such as acrylic resin or glass. Moreover, the vibration plate 81 is designed to have a thickness of 0.4 mm to 1.5 mm, for example.

The vibration plate 81 is joined to the other principal face of the stacked body 14 constituting the piezoelectric element 11 via a joining member 82. The other principal face may be either entirely joined or substantially entirely joined to the vibration plate 81 via the joining member 82.

The joining member 82 is shaped like a film. Moreover, the joining member 82 is made of a material which is softer and higher in deformability than the vibration plate 81, and is thus smaller than the vibration plate 81 in modulus of elasticity such as Young's modulus, modulus of rigidity, and bulk modulus, and in rigidity. That is, the joining member 82 is capable of deformation when the vibration plate 81 is vibrated by the actuation of the piezoelectric element 11, and, given that the joining member 82 and the vibration plate 81 are subjected to the same force, then the joining member 82 becomes deformed more greatly than the vibration plate 81. The other principal face (principal face pointing in a negative z-axis direction in the drawing) of the stacked body 14 is wholly fixed to one principal face (principal face pointing in a positive z-axis direction in the drawing) of the joining member 82, and, part of one principal face (principal face pointing in the positive z-axis direction in the drawing) of the vibration plate 81 is fixed to the other principal face (principal face pointing in the negative z-axis direction in the drawing) of the joining member 82.

In the case of joining the stacked body 14 and the vibration plate 81 together via the deformable joining member 82, upon transmission of vibration from the piezoelectric element 11, the deformable joining member 82 becomes deformed more greatly than the vibration plate 81.

At this time, vibration in reverse phase reflected from the vibration plate 81 can be mitigated by the deformable joining member 82, wherefore the piezoelectric element 11 is capable of transmitting strong vibration to the vibration plate 81 without incurring the influence of ambient vibration.

In particular, it is preferable that the joining member 82 is, at least partly, composed of a viscoelastic body. In this case, strong vibration from the piezoelectric element 11 can be transmitted to the vibration plate 81 properly, and also weak vibration reflected from the vibration plate 81 can be absorbed by the joining member 82. For example, use can be made of a double-faced tape formed by applying an adhesive to both sides of a base material made of a nonwoven fabric or the like, and a joining member including an adhesive having elasticity, each having a thickness of 10 μm to 2000 μm, for example.

The joining member 82 may be either a one-piece member or a composite body composed of several members. As such a joining member 82, for example, a double-faced tape formed by applying an adhesive to both sides of a base material made of a nonwoven fabric or the like, and a variety of elastic adhesives, namely adhesives having elasticity are desirable for use. Moreover, although it is preferable that the thickness of the joining member 82 is greater than the amplitude of flexural vibration of the piezoelectric element 11, too large a thickness will cause attenuation of vibration. Thus, the joining member 82 is designed to have a thickness of 0.1 mm to 0.6 mm, for example. However, in the piezoelectric vibrating apparatus pursuant to the invention, there is no particular limitation to the material used for the joining member 82, and the joining member 82 may therefore be made of a material which is harder and less deformable than the vibration plate 81. Moreover, under certain circumstances, the joining member 82 may be omitted from the construction.

The thereby constructed piezoelectric vibrating apparatus in the present embodiment functions as a piezoelectric vibrating apparatus in which the piezoelectric element 11 is flexurally vibrated under application of an electric signal, and the vibration plate 81 is vibrated in response to the flexural vibration. Note that the other end of the vibration plate 81 in its lengthwise direction (end pointing in a negative y-axis direction in the drawing) or the periphery of the vibration plate 81 may be supported by a non-illustrated support member.

Moreover, in the piezoelectric vibrating apparatus in the present embodiment, the vibration plate 81 is joined to the other principal face of the piezoelectric element 11 which is a flat surface. Thus, it is possible to obtain the piezoelectric vibrating apparatus in which the stacked body 14 and the vibration plate 81 are firmly joined to each other.

The piezoelectric vibrating apparatus in the present embodiment is constructed of the piezoelectric element 11 which suppresses occurrence of delamination in the side face located at the end of the stacked body 14, and is thus built as a piezoelectric vibrating apparatus which can be driven with stability for a long period of time by virtue of its excellent durability.

Figure 6:
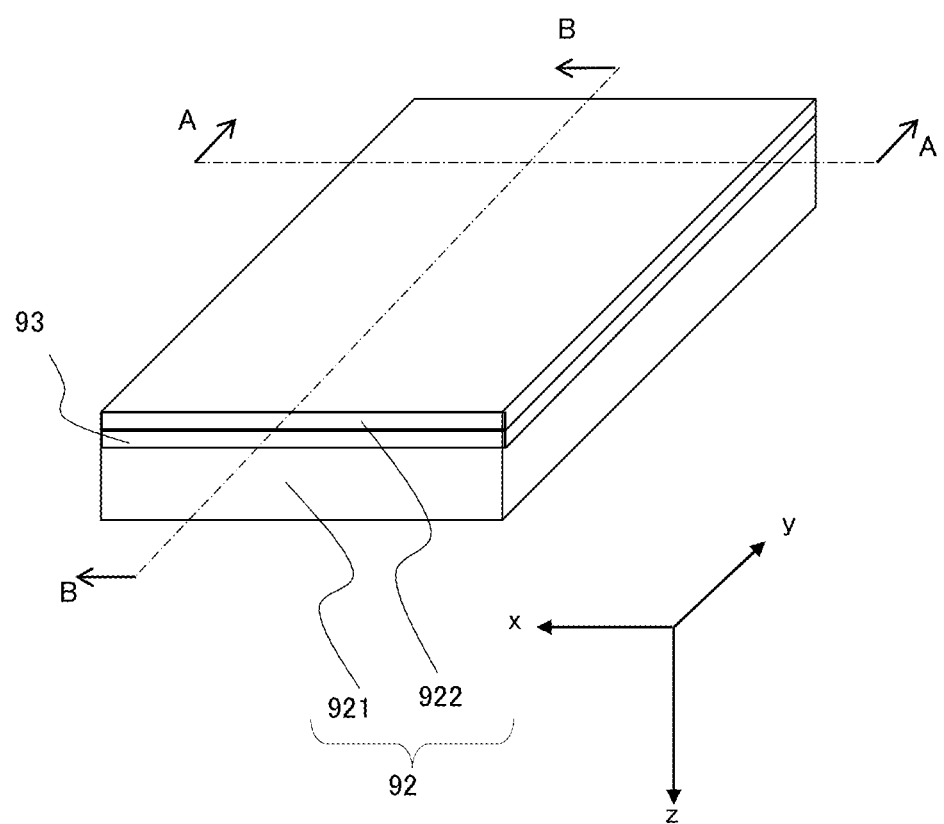
FIG. 6 is a schematic perspective view schematically showing an embodiment of a portable terminal pursuant to the invention.
Figure 7:
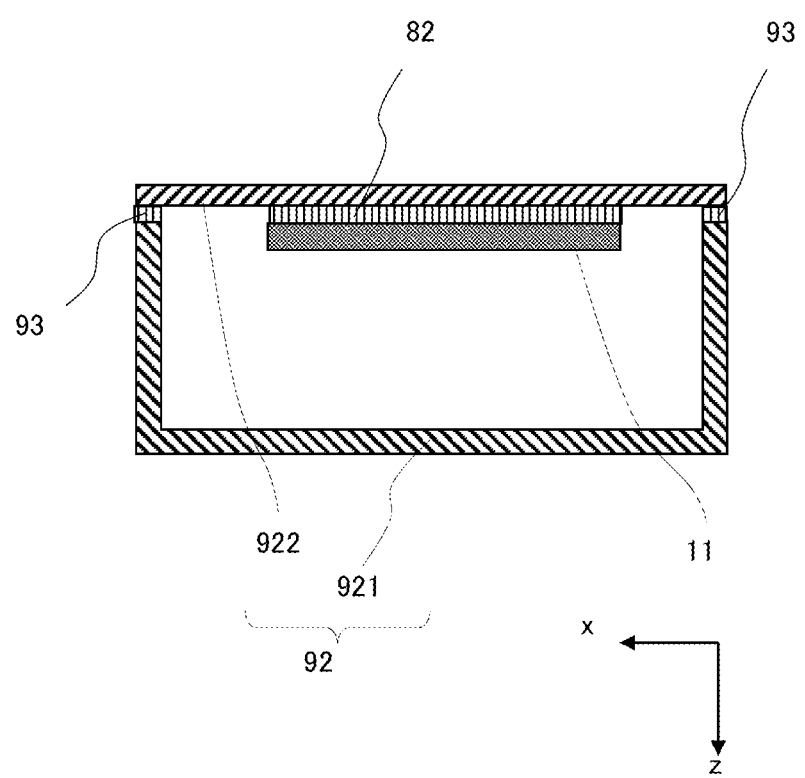
FIG. 7 is a schematic sectional view taken along the line A-A shown in FIG. 6.
Figure 8:
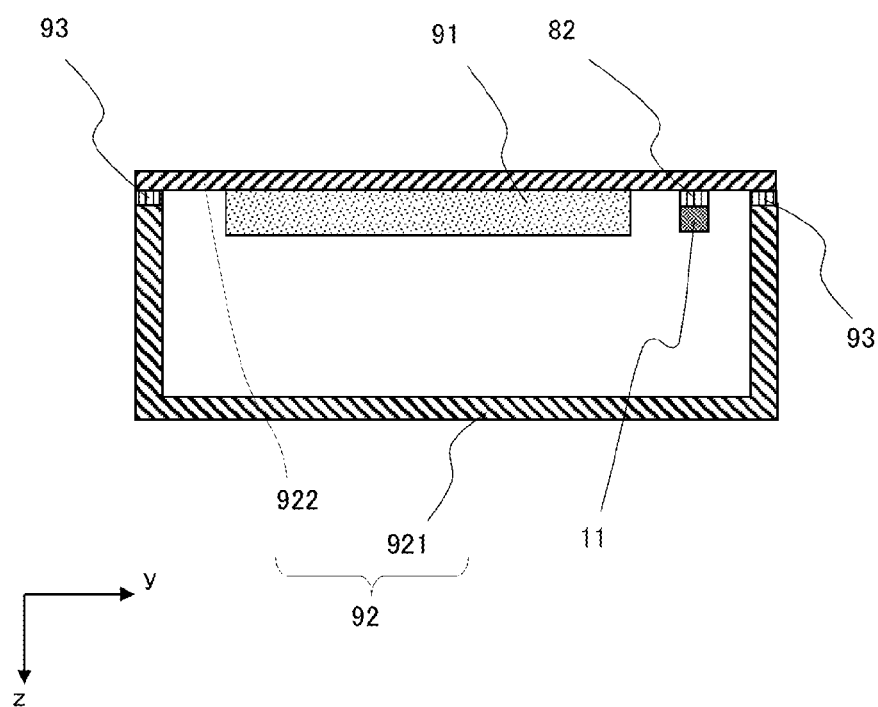
FIG. 8 is a schematic sectional view taken along the line B-B shown in FIG. 6.

As shown in FIGS. 6 to 8, a portable terminal in the present embodiment comprises the piezoelectric element 11, an electronic circuit (not shown), a display 91, and a housing 92. The other principal face of the piezoelectric element 11 (the stacked body 14) is joined to the housing 92. FIG. 5 is a schematic perspective view schematically showing the portable terminal pursuant to the invention, FIG. 7 is a schematic sectional view taken along the line A-A shown in FIG. 6, and FIG. 8 is a schematic sectional view taken along the line B-B shown in FIG. 6. A flexible substrate joined to the one principal face of the stacked body 14 is omitted from FIGS. 7 and 8.

It is preferable that the piezoelectric element 11 (the stacked body 14) and the housing 92 are joined to each other via a deformable joining member. That is, in FIGS. 7 and 8, a joining member 82 is the deformable joining member.

In the case of joining the piezoelectric element 11 and the housing 92 together via the deformable joining member 82, upon transmission of vibration from the piezoelectric element 11, the deformable joining member 82 becomes deformed more greatly than the housing 92.

At this time, vibration in reverse phase reflected from the housing 92 can be mitigated by the deformable joining member 82, wherefore the piezoelectric element 11 is capable of transmitting strong vibration to the housing 92 without incurring the influence of ambient vibration.

In particular, it is preferable that the joining member 82 is, at least partly, composed of a viscoelastic body. In this case, strong vibration from the piezoelectric element 11 can be transmitted to the housing 92 properly, and also weak vibration reflected from the housing 92 can be absorbed by the joining member 82. For example, use can be made of a double-faced tape formed by applying an adhesive to both sides of a base material made of a nonwoven fabric or the like, and a joining member including an adhesive having elasticity, each having a thickness of 10 μm to 2000 μm, for example.

In this embodiment, the piezoelectric element 11 is attached to a panel constituting part of the housing 92 which serves as a cover for the display 91, and, that part of the housing 92 functions as a vibration plate 922.

Although this embodiment is illustrated as being designed so that the piezoelectric element 11 is joined to the housing 92, the piezoelectric element 11 may be joined to the display 91.

The housing 92 comprises a box-shaped housing main body 921 with its one face left opened, and a vibration plate 922 which blocks the opening of the housing main body 921. The housing 92 (the housing main body 921 and the vibration plate 922) can be formed with proper use of a material having high rigidity and great elasticity, such as synthetic resin.

The periphery of the vibration plate 922 is attached for vibrating motion to the housing main body 921 via a joining material 93. The joining material 93 is made of a material which is softer and higher in deformability than the vibration plate 922, and is thus smaller than the vibration plate 922 in modulus of elasticity such as Young's modulus, modulus of rigidity, and bulk modulus, and in rigidity. That is, the joining material 93 is deformable, and, given that the joining material 93 and the vibration plate 922 are subjected to the same force, then the joining material 93 becomes deformed more greatly than the vibration plate 922.

The joining material 93 may be either a one-piece member or a composite body composed of several members. As such a joining material 93, for example, a double-faced tape formed by applying an adhesive to both sides of a base material made of a nonwoven fabric or the like is desirable for use. The joining material 93 is so designed as not to have too large a thickness which causes attenuation of vibration, and more specifically the thickness of the joining material 93 falls in the range of 0.1 mm to 0.6 mm, for example. However, in the portable terminal pursuant to the invention, there is no particular limitation to the material used for the joining material 93, wherefore the joining material 93 may be made of a material which is harder and less deformable than the vibration plate 922. Moreover, under certain circumstances, the joining material 93 may be omitted from the construction.

The electronic circuit (not shown) is exemplified by a circuit for processing image information shown on the display 91 and sound information transmitted by the portable terminal, or a communication circuit. The electronic circuit may be constructed of either at least one of such circuits or all of them. Another circuit having different capability may also be adopted. Moreover, the plurality of electronic circuits may be provided. The electronic circuit and the piezoelectric element 11 are connected to each other by non-illustrated wiring for connection.

The display 91 is a display device having the function of showing image information, and, a heretofore known display such for example as a liquid crystal display, a plasma display, or an organic EL display is suitable for use as the display 91. The display 91 may be provided with an input device such as a touch panel. Moreover, the cover (the vibration plate 922) for the display 91 may be provided with an input device such as a touch panel. Furthermore, the whole or part of the display 91 may be designed to serve as a vibration plate.

The portable terminal in the present embodiment is constructed of the piezoelectric element 11 which suppresses occurrence of delamination in the side face located at the end of the stacked body 14, and is thus built as a portable terminal which can be driven with stability for a long period of time by virtue of its excellent durability.

Moreover, the portable terminal in the present embodiment is characterized in that the display 91 or the housing 92 produces vibration to transmit sound information through ear cartilage or by air conduction. The portable terminal in the present embodiment is capable of effecting transmission of sound information by transmitting vibration to ear cartilage through the direct contact of the vibration plate (the display 91 or the housing 92) with the ear, or the contact of the vibration plate with the ear via other object. That is, transmission of sound information can be achieved by transmitting vibration to ear cartilage through the direct or indirect contact of the vibration plate (the display 91 or the housing 92) with the ear. This makes it possible to transmit sound information clearly even in a noisy environment, for example, and thereby provide a portable terminal which enables users including persons with hearing difficulty to hear sound properly. The object to be placed between the vibration plate (the display 91 or the housing 92) and the ear may be of any given type which is capable of transmission of vibration, and, examples of the object include a cover for the portable terminal, headphones, and earphones. Moreover, the portable terminal may be designed to effect transmission of sound information by causing sound produced from the vibration plate (the display 91 or the housing 92) to propagate through the air. Furthermore, the portable terminal may be designed to transmit sound information via a plurality of routes.

Figure 9:
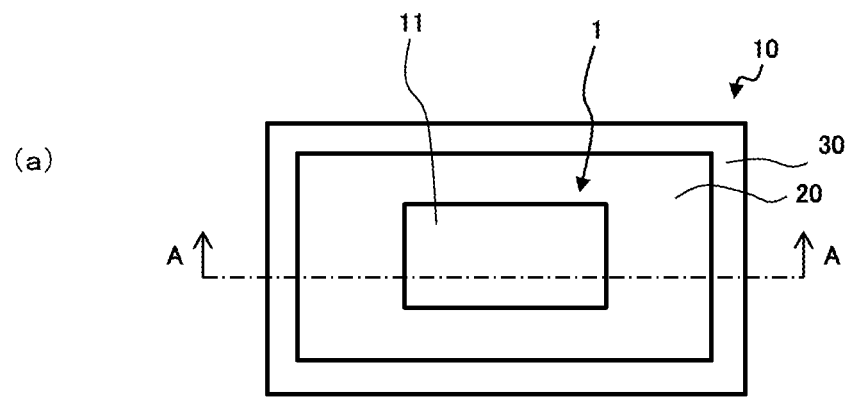
FIG. 9(a) is a schematic plan view showing the general structure of an embodiment of a sound generator pursuant to the invention.
FIG. 9(b) is a schematic sectional view of one embodiment taken along the line A-A shown in FIG. 9(a)
FIG. 9(c) is a schematic sectional view of another embodiment taken along the line A-A shown in FIG. 9(a)
Figure 9:
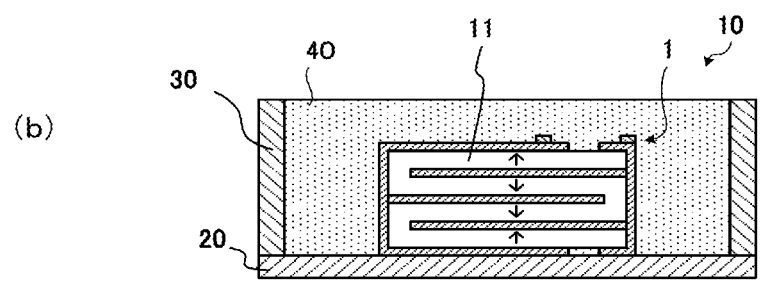
Figure 9:
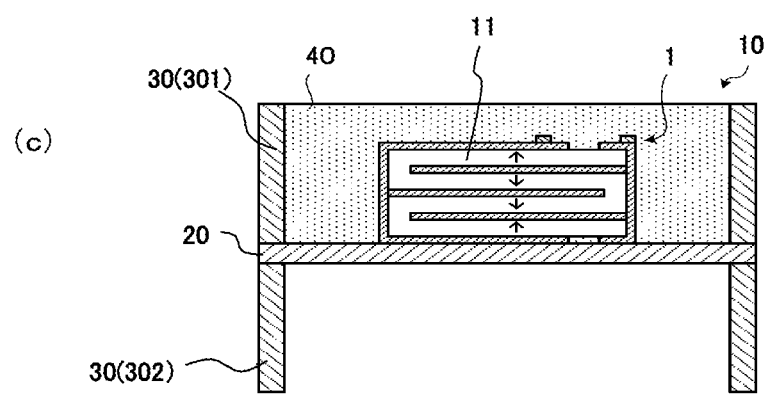

Moreover, as shown in FIG. 9, a sound generator 10 in the present embodiment comprises: the aforestated piezoelectric element 11; a vibration plate 20 to which the piezoelectric element 11 is attached, the vibration plate 20 vibrating in response to vibration of the piezoelectric element 11; and a frame body 30 attached to at least part of the outer periphery of the vibration plate 20 so as to serve as a support body for supporting the vibration plate 20.

The piezoelectric element 11 is an exciter which excites the vibration plate 20 when vibrated by application of voltage. The principal face of the piezoelectric element 11 and the principal face of the vibration plate 20 are joined to each other with an adhesive such as epoxy resin. The piezoelectric element 11 imparts vibration of predetermined level to the vibration plate 20 when flexurally vibrated, thus achieving sound production.

The vibration plate 20 is, at its edge, secured to the frame body 30 under tension, and vibrates together with the piezoelectric element 11 in response to vibration of the piezoelectric element 11. Various materials, including resin and metal may be used to form the vibration plate 20, and more specifically, for example, the vibration plate 20 may be formed of a 10 to 200 μm-thick resin film made of polyethylene, polyimide, polypropylene, or the like. As compared with a metal plate for example, a resin film has a lower elastic modulus and a lower mechanical Q value, wherefore the use of a resin film for the vibration plate 20 makes it possible to cause the vibration plate 20 to flexurally vibrate with a greater amplitude, and thereby increase the width of a peak in resonance and decrease the height of the peak in sound-pressure frequency characteristics, thus reducing a gap between the peak and the dip in the resonance.

The frame body 30 serves as a support body for supporting the vibration plate 20 at the edge of the vibration plate 20, and, various materials, including metal such as stainless steel and resin, may be used to form the frame body 30. The frame body 30 may be constructed of either a single frame member (upper frame member 301) as shown in FIG. 9(b), or two frame members (upper frame member 301 and lower frame member 302) as shown in FIG. 9(c). In the latter case, the vibration plate 20 is held between the two frame members, and can thus be tensioned stably. The upper frame member 301 and the lower frame member 302 are each designed to have a thickness of 100 μm to 5000 μm, for example.

As shown in FIGS. 9(b) and 9(c), it is preferable that the sound generator 10 in the present embodiment is further provided with a resin layer 40 provided so as to cover the piezoelectric element 11, and the surface of the vibration plate 20, at least that part thereof which lies around the piezoelectric element 11. For example, acrylic resin may be used for the resin layer 40. By embedding the piezoelectric element 11 in such a resin layer 40, it is possible to induce adequate damping effect, and thereby suppress occurrence of a resonance phenomenon, thus minimizing peaks and dips in sound-pressure frequency characteristics. As shown in FIGS. 9(b) and 9(c), the resin layer 40 may be formed flush with the upper frame member 301.

The sound generator 10 in the present embodiment is constructed of the piezoelectric element 11 which suppresses occurrence of delamination in the side face located at the end of the stacked body 14, and can thus be driven with stability for a long period of time by virtue of its excellent durability.

The following describes an embodiment of a sound-generating apparatus pursuant to the invention.

Figure 10:
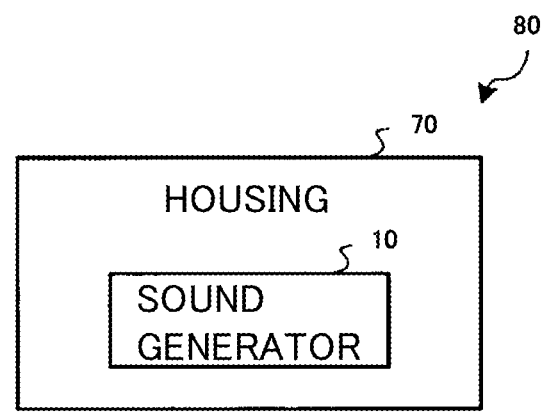
FIG. 10 is a diagram showing the structure of an embodiment of a sound-generating apparatus pursuant to the invention.

A sound-generating apparatus 80 is a sounding apparatus like a so-called speaker. As shown in FIG. 10, the sound-generating apparatus 80 comprises the sound generator 10 and a housing 70 for accommodating the sound generator 10. The housing 70 causes internal resonance of sound generated by the sound generator 10, and allows the sound to radiate out of the housing 70 through a non-illustrated opening formed in the housing 70. The placement of such a housing 70 makes it possible to increase sound pressure in a low-frequency range, for example.

Such a sound-generating apparatus 80 may be used alone as a speaker, and may also be suitably incorporated into a portable terminal, a flat-screen television set, a tablet terminal, and so forth as will hereafter be described. Moreover, the sound-generating apparatus 80 may be incorporated into household electric appliances which have heretofore been developed without placing emphasis on sound quality, such as refrigerators, microwave ovens, cleaners, and washing machines.

The sound-generating apparatus 80 embodying the invention is constructed of the piezoelectric element 11 that suppresses occurrence of delamination in the side face located at the end of the stacked body 14, and can thus be driven with stability for a long period of time by virtue of its excellent durability.

Figure 11:
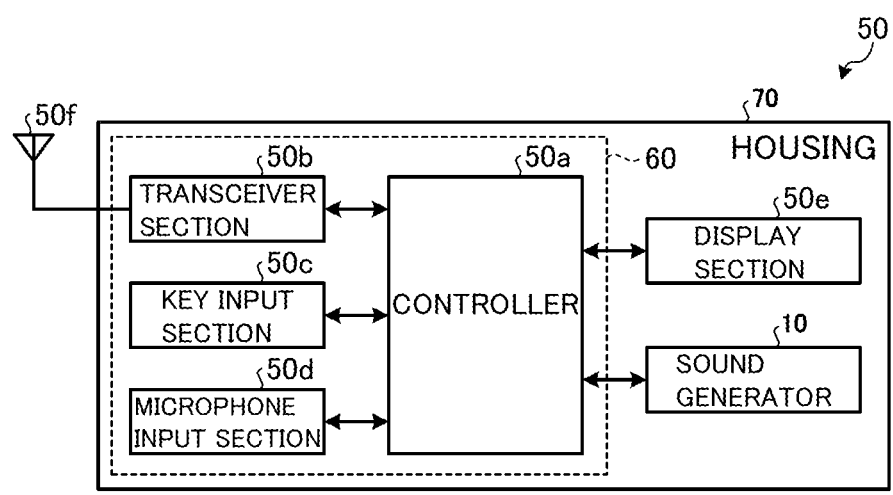
FIG. 11 is a diagram showing the structure of an embodiment of an electronic device pursuant to the invention.

Next, an electronic device equipped with the sound generator will be described with reference to FIG. 11. FIG. 11 is a diagram showing the structure of an electronic device 50 in an embodiment. In the diagram, there are shown only the constituent components considered necessary for explanation of the device, and typical constituent components are not shown.

As shown in FIG. 11, the electronic device 50 in this embodiment comprises: the sound generator 10; an electronic circuit 60 connected to the sound generator 10; and a housing 70 for accommodating the electronic circuit 60 and the sound generator 10. The electronic device 50 has the function of causing the sound generator 10 to produce sound.

The electronic device 50 includes the electronic circuit 60. For example, the electronic circuit 60 is composed of a controller 50a, a transceiver section 50b, a key input section 50c, and a microphone input section 50d. The electronic circuit 60 is connected to the sound generator 10 for output of a sound signal to the sound generator 10. The sound generator 10 produces sound in response to the sound signal inputted to it from the electronic circuit 60.

Moreover, the electronic device 50 includes a display section 50e, an antenna 50f, and the sound generator 10. In addition, the electronic device 50 includes the housing 70 for accommodating these devices. In FIG. 11, there is shown a case where all of the devices including the controller 50a are accommodated in a single housing 70, but this does suggest any limitation to the way to store each device. In the present embodiment, it is essential only that at least the electronic circuit 60 and the sound generator 10 be accommodated in a single housing 70.

The controller 50a is a control section of the electronic device 50. The transceiver section 50b effects, for example, transmission and reception of data via the antenna 50f under the control of the controller 50a. The key input section 50c is an input device of the electronic device 50 for accepting key input operation performed by an operator. Similarly, the microphone input section 50d is an input device of the electronic device 50 for accepting, for example, sound input operation performed by an operator. The display section 50e is a display output device of the electronic device 50 for producing output of information to be displayed under the control of the controller 50a.

The sound generator 10 operates as a sound output device of the electronic device 50. The sound generator 10 is connected to the controller 50a of the electronic circuit 60 so as to produce sound under applied voltage controlled by the controller 50a.

Although the electronic device 50 has been illustrated as being in the form of a portable terminal as shown in FIG. 11, the electronic device 50 is applicable to various consumer electronics having sound-producing capability without limitation in form. For example, the electronic device 50 may be applied to various products having sound-producing capability, such as "speaking" capability, including cleaners, washing machines, refrigerators, and microwave ovens, let alone flat-screen television sets and automotive audio equipment.

Such an electronic device 50 is constructed of the piezoelectric element 11 that suppresses occurrence of delamination in the side face located at the end of the stacked body 14, and is thus built as an electronic device which can be driven with stability for a long period of time by virtue of its excellent durability.

EXAMPLES

The following describes a specific example of the piezoelectric element pursuant to the invention. That is, the piezoelectric element shown in FIGS. 1 and 2 was produced in the following manner.

The piezoelectric element was shaped in a rectangular prism which is 23.5 mm in length, 3.3 mm in width, and 0.5 mm in thickness. Moreover, the piezoelectric element was constructed by alternately stacking 30 μm-thick piezoelectric layers and internal electrodes, and, the total number of the piezoelectric layers is 16. The piezoelectric layer was made of lead zirconate titanate. A silver-palladium alloy was used for the internal electrode.

Ceramic green sheets with printed silver palladium-made electrically-conductive pastes were laminated on top of each other in layers. Then, the laminate has been pressurized so that the ceramic green sheets adhere tightly to each other, has been subjected to degreasing treatment at a predetermined temperature, and has been fired at 1000° C., whereupon a multilayer sintered product was obtained.

Next, the surface electrodes were formed from a silver paste. The silver paste has been printed in a manner such that each widthwise end of the surface electrode extends by an amount of 1 mm beyond each widthwise end of the internal electrode, and subsequently baking process has been performed.

A voltage having an electric field strength of 2 kV/mm has been applied between the internal electrodes (between the first primary electrodes, between the second primary electrodes) through the surface electrode to initiate a polarization of the piezoelectric element.

Figure 12:
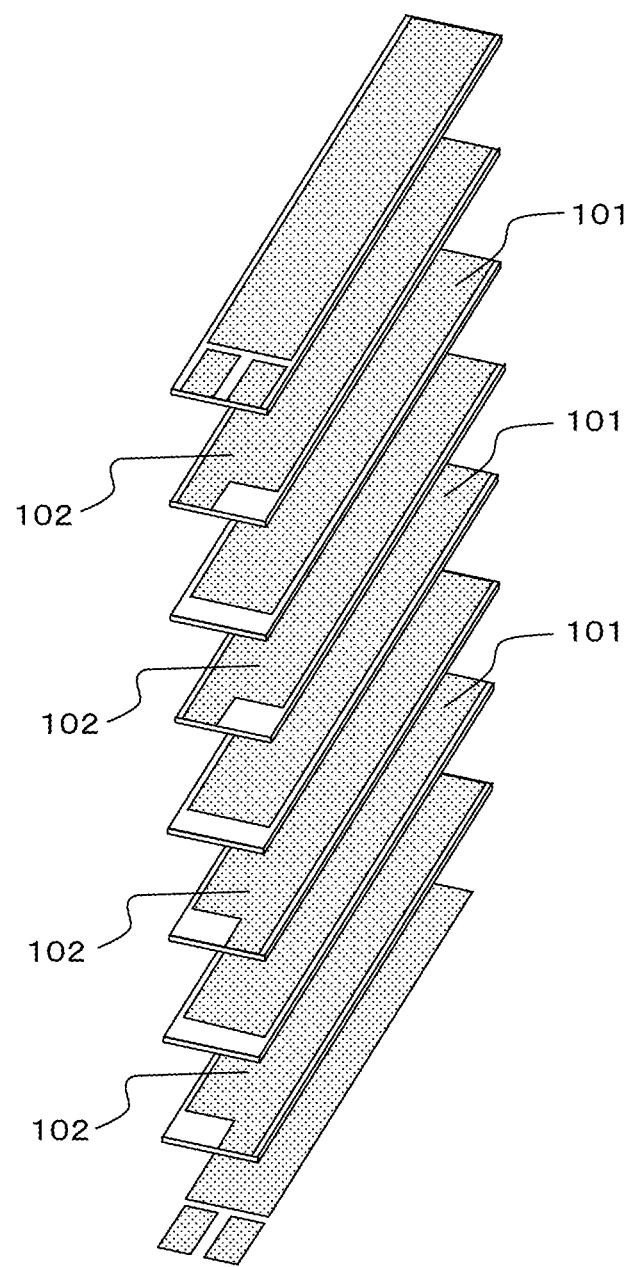
FIG. 12 is an exploded perspective view showing an embodiment of a conventional piezoelectric element.

As an example of the invention (Sample No. 1), there was produced a piezoelectric element having a pattern as shown in FIGS. 1 and 2 defining the internal electrodes with the secondary electrodes. On the other hand, as a comparative example (Sample No. 2), there was produced a piezoelectric element having a pattern as shown in FIG. 12 defining the internal electrodes without the secondary electrodes.

In a driving test, a sinusoidal signal of ±10 Vrms was applied to each piezoelectric element through a flexible wiring board at a frequency of 1 kHz. The result of the test has showed that both of Sample No. 1 and Sample No. 2 have been flexurally vibrated with a displacement of 100 μm.

After that, as a driving test, each piezoelectric element has been driven under continuous application of sinusoidal signals of ±10 Vrms in 100000 cycles. As a result, a decrease in displacement occurred in Sample No. 2 which is the comparative example.

In contrast, it was possible to drive Sample No. 1, which is the example of the piezoelectric actuator of the invention, continuously even after the completion of 100000 cycles of signal application without occurrence of a decrease in displacement.

It has thus been confirmed that the use of the piezoelectric element of the invention achieves stability of displacement. It has also been confirmed that the piezoelectric element is free from troubles such as accidental separation of the side electrodes (end electrodes), occurrence of delamination, and a decrease in adhesion strength even after long-term continuous operation.

REFERENCE SIGNS LIST

1: Piezoelectric actuator
11: Piezoelectric element
12: Internal electrode
121: First primary electrode
1211: Active region
1212: Led-out region
122: Second primary electrode
1221: Active region
1222: Led-out region
13: Piezoelectric layer
14: Stacked body
15: Surface electrode
151: First surface electrode
152: Second surface electrode
153: Third surface electrode
16: Side electrode
171: First secondary electrode
172: Second secondary electrode
81: Vibration plate
82: Joining member
91: Display
92: Housing
921: Housing main body
922: Vibration plate
93: Joining material
10: Sound generator
20: Vibration plate
30: Frame body
301: Upper frame member
302: Lower frame member
40: Resin layer 50: Electronic device
60: Electronic circuit
70: Housing
80: Sound-generating apparatus

The invention claimed is:

1. A piezoelectric element, comprising:
a stacked body in which a plurality of internal electrodes and a plurality of piezoelectric layers are laminated, the stacked body being shaped in a rectangular plate as seen in a plan view;
a plurality of surface electrodes disposed at least on one principal face of the stacked body; and
a plurality of side electrodes disposed on a side face of the stacked body, the plurality of internal electrodes extending to the side face, the plurality of side electrodes electrically connecting the plurality of internal electrodes extending to the side face and the plurality of surface electrodes,
the plurality of internal electrodes each including a first primary electrode having an active region which has a relatively wide rectangular shape and a led-out region whose width is relatively narrow,
a first secondary electrode, the first primary electrodes being disposed in inter-piezoelectric layer regions, the first secondary electrodes being disposed in the inter-piezoelectric layer regions so as to be apart from the led-out regions of the first primary electrodes, and
a second primary electrode, the second primary electrodes being disposed alternately with the first primary electrodes in a stacking direction of the stacked body so as to face the active regions of the first primary electrodes,
an arrangement of a first primary electrode and a first secondary electrode which are located on one principal face side in the stacking direction of the stacked body and an arrangement of a first primary electrode and a first secondary electrode which are located on the other principal face side in the stacking direction of the stacked body being in line-symmetric relation to each other about a widthwise central axis,
both of the led-out region of the first primary electrode and the first secondary electrode being extended to one end face in a longitudinal direction of the stacked body,
the first primary electrode located on the one principal face side and the first secondary electrode located on the other principal face side being connected to a first side electrode located on the one end face, and the first primary electrode located on the other principal face side and the first secondary electrode located on the one principal face side being connected to a second side electrode located on the one end face,
all of the second primary electrodes being extended to the other end face in the longitudinal direction of the stacked body, and being connected to a third side electrode located on the other end face.

2. The piezoelectric element according to claim 1, wherein the led-out region of the first primary electrode and the first secondary electrode are equal in width.

3. The piezoelectric element according to claim 1, wherein
the stacked body includes a region where the first secondary electrodes and the second primary electrodes are opposed to each other as seen in a transparent plan view in the stacking direction of the stacked body, and a direction of polarization of a piezoelectric layer in a region where the first primary electrodes and the second primary electrodes are opposed to each other and a direction of polarization of a piezoelectric layer in the region where the first secondary electrodes and the second primary electrodes are opposed to each other, are opposite to each other.

4. The piezoelectric element according to claim 1, wherein materials of the first primary electrode, the second primary electrode, and the first secondary electrode, are same in composition.

5. The piezoelectric element according to claim 1, wherein the piezoelectric element is built as a bimorph piezoelectric element.

6. A piezoelectric vibrating apparatus, comprising:
the piezoelectric element according to claim 1; and
a vibration plate joined to the other principal face of the piezoelectric element.

7. A portable terminal, comprising:
the piezoelectric element according to claim 1;
an electronic circuit;
a display; and
a housing,
the display or the housing being joined to the other principal face of the piezoelectric element.

8. A sound generator, comprising:
the piezoelectric element according to claim 1;
a vibration plate to which the piezoelectric element is attached, the vibration plate vibrating in response to vibration of the piezoelectric element; and
a support body attached to at least part of an outer periphery of the vibration plate, the support body supporting the vibration plate.

9. A sound-generating apparatus, comprising:
the sound generator according to claim 8; and
a housing which accommodates the sound generator.

10. An electronic device, comprising:
the sound generator according to claim 8;
an electronic circuit connected to the sound generator; and
a housing which accommodates the electronic circuit and the sound generator,
the electronic device having a function of causing the sound generator to produce sound.

* * * * *